US010179958B2

(12) United States Patent
Kellerman et al.

(10) Patent No.: US 10,179,958 B2
(45) Date of Patent: Jan. 15, 2019

(54) APPARATUS AND METHOD FOR CRYSTALLINE SHEET GROWTH

(71) Applicant: Varian Semiconductor Equipment Associates, Inc., Gloucester, MA (US)

(72) Inventors: Peter L. Kellerman, Essex, MA (US); Brian D. Kernan, Andover, MA (US); Frederick M. Carlson, Potsdam, NY (US); Dawei Sun, Lynnfield, MA (US); David Morrell, Wakefield, MA (US)

(73) Assignee: VARIAN SEMICONDUCTOR EQUIPMENT ASSOCIATES, INC, Gloucester, MA (US)

( * ) Notice: Subject to any disclaimer, the term of this patent is extended or adjusted under 35 U.S.C. 154(b) by 0 days.

(21) Appl. No.: 15/455,437

(22) Filed: Mar. 10, 2017

(65) Prior Publication Data

US 2018/0080142 A1    Mar. 22, 2018

Related U.S. Application Data

(60) Provisional application No. 62/395,732, filed on Sep. 16, 2016.

(51) Int. Cl.
| | |
|---|---|
| *C30B 15/06* | (2006.01) |
| *C30B 15/20* | (2006.01) |
| *C30B 15/10* | (2006.01) |
| *C30B 29/06* | (2006.01) |

(52) U.S. Cl.
CPC .............. *C30B 15/20* (2013.01); *C30B 15/06* (2013.01); *C30B 15/10* (2013.01); *C30B 29/06* (2013.01)

(58) Field of Classification Search
CPC .............................. C30B 15/002; C30B 15/06
See application file for complete search history.

(56) References Cited

U.S. PATENT DOCUMENTS

| | | | |
|---|---|---|---|
| 4,264,407 A | 4/1981 | Shudo et al. | |
| 4,289,571 A | 9/1981 | Jewett | |
| 4,329,195 A * | 5/1982 | Kudo ................... | C30B 15/002 117/27 |

(Continued)

FOREIGN PATENT DOCUMENTS

WO    2015148156 A1    10/2015

OTHER PUBLICATIONS

Kudo, B., "Improvements in the Horizontal Ribbon Growth Technique for Single Crystal Silicon," J. Crystal Growth, 50 (1980) 247-259.

(Continued)

*Primary Examiner* — Robert M Kunemund

(57) ABSTRACT

An apparatus for forming a crystalline sheet. The apparatus may include a crystallizer comprising a first gas channel and a second gas channel, wherein the first gas channel and second gas channel extend through the crystallizer to a lower surface of the crystallizer between an upstream edge and a downstream edge. The first gas channel may be disposed closer to the downstream edge than the second gas channel. A first gas source may be coupled to the first gas channel, where the first gas source comprises helium or hydrogen, and a second gas source may be coupled to the second gas channel, where the second gas source does not contain hydrogen or helium.

19 Claims, 6 Drawing Sheets

(56) References Cited

U.S. PATENT DOCUMENTS

| | | | |
|---|---|---|---|
| 4,417,944 A * | 11/1983 | Jewett | C30B 15/06 117/212 |
| 7,816,153 B2 | 10/2010 | Kellerman et al. | |
| 7,855,087 B2 | 12/2010 | Kellerman et al. | |
| 8,603,242 B2 * | 12/2013 | Cohen | C30B 15/06 117/70 |
| 9,567,691 B2 * | 2/2017 | Kellerman | C01B 33/037 |
| 9,957,636 B2 | 5/2018 | Kellerman et al. | |
| 2009/0233396 A1 | 9/2009 | Kellerman et al. | |
| 2010/0025885 A1 | 2/2010 | Clark | |
| 2010/0288186 A1 | 11/2010 | Bang | |
| 2011/0271899 A1 * | 11/2011 | Kellerman | C30B 15/06 117/27 |
| 2013/0213295 A1 | 8/2013 | Mackintosh et al. | |
| 2013/0213296 A1 | 8/2013 | Kellerman et al. | |

OTHER PUBLICATIONS

Kellerman, et al., "Floating Silicon Method Single Crystal Ribbon-Observations and Proposed Limit Cycle Theory," J. Crystal Growth, 451 (2016) 174-180.

* cited by examiner

DIRECT FIRST INERT GAS FLOW THROUGH CRYSTALLIZER WHEN CRYSTALLIZER IS DISPOSED AT FIRST SEPARATION WITH RESPECT TO MELT, CRYSTALLIZER COMPRISING FIRST CHANNEL AND SECOND CHANNEL
402

MOVE CRYSTALLIZER BLOCK TO SECOND SEPARATION WITH RESPECT TO MELT, WHEREIN SECOND SEPARATION LESS THAN FIRST SEPARATION
404

DIRECT FIRST GAS FLOW COMPRISING HELIUM GAS FLOW OR HYDROGEN GAS FLOW THROUGH FIRST CHANNEL WHILE DIRECTING SECOND INERT GAS FLOW THROUGH SECOND CHANNEL WHEN CRYSTALLIZER DISPOSED AT SECOND SEPARATION.
406

APPARATUS AND METHOD FOR CRYSTALLINE SHEET GROWTH

RELATED APPLICATIONS

This application claims priority to U.S. Provisional Patent Application No. 62/395,732, entitled "System and Method for Crystalline Sheet Growth," filed Sep. 16, 2016, and incorporated by reference herein in its entirety.

FIELD

The present embodiments relate to growth of crystalline material from a melt and more particularly to a system and method of cooling the melt.

BACKGROUND

Silicon wafers or sheets may be used in, for example, the integrated circuit or solar cell industry. Demand for solar cells continues to increase as the demand for renewable energy sources increases. One major cost in the solar cell industry is the wafer or sheet used to make solar cells. Reductions in cost to the wafers or sheets may reduce the cost of solar cells and make this renewable energy technology more prevalent. One method that has been investigated to lower the cost of materials for solar cells is the horizontal pulling of thin silicon ribbons from a melt that cool and solidify into a crystalline sheet, referred to herein as horizontal sheet growth.

In producing a silicon crystalline sheet by a horizontal sheet growth method known as the Floating Silicon Method (FSM), a useful component is a cooling device, which cooling device removes latent heat from the silicon crystalline sheet via the impingement of a cooling gas, for instance Helium, onto the ribbon surface. The cooling device may be arranged as a long slit or channel through which channel the cooling gas flows and is directed onto the ribbon surface. The cooling device is positioned a few mm above the surface of the crystallizing sheet during growth, and may be moved away from the surface when the ribbon (crystallizing sheet) is not being grown. The ribbon is grown underneath the slit and pulled at a constant rate to one side in order to grow continuous lengths of ribbon.

In particular, during horizontal sheet growth of silicon, the cooling device may employ a cold block, where the cold block may be used to crystallize a horizontal sheet from a silicon melt. Due to the crystalline structure of silicon, the leading edge of a single crystalline sheet, sometimes referred to as a "single-crystal ribbon," or "silicon ribbon," is defined by a (111) facet. Growing this faceted leading edge at a fast rate (>1 mm/s) entails the use of intense heat removal within a very narrow region at the leading edge of the single-crystal ribbon, where peak heat removal may be well over 100 W/cm$^2$. In order to generate such high cooling rates, generating a vortex between a relatively hot single-crystal ribbon surface and the cooling device is useful. This vortex may be created by flowing gas at a rapid rate from a channel or passage in the cooling device, such as a cold block, toward the melt surface of the silicon melt (molten Si). Such a vortex may disadvantageously also carry SiO from the molten Si to a cold surface of the cooling device, where the SiO condenses, forming SiOx particulates. Accordingly, the growth of a crystalline sheet of silicon may entail a balance between maintaining the high heat transfer from the solidifying silicon ribbon to the cooling device, while at the same time avoiding SiOx deposition.

Another challenge related to silicon horizontal sheet growth is the need to avoid SiOx formation in a furnace before sheet growth. To form a silicon melt, a Si melt-in process may be employed prior to forming a crystalline sheet from the silicon melt. During the Si melt-in process, a cooling device may be raised to a separation from the melt surface of, for example, greater than 1 cm from the melt surface. During this melt-in time, the concentration of SiO may be high due to the high temperature employed during melt-in (well above the Si melt temperature), as well as the possibility of silicon feedstock having SiO$_2$ on the large effective surface area of the silicon. Preventing this SiO from condensing on all "cold" surfaces (where a "cold surface" may be defined for the purposes of illustration in the context of silicon ribbon growth as a surface having a temperature less than 1250 C) of the cooling device is especially useful, even when the cooling device is disposed at a separation >1 cm above the melt. Notably, in a cooling device including a water cooled cold block, there is an inherent temperature gradient between the surface of the water-cooled cold block (providing the heat removal), and the outside walls of the cooling device, where the outside walls are heated to above Si melt temperature (1412° C.). This temperature gradient will result in exposed areas of the cooling device that constitute such "cold" surface, at a temperature less than 1250° C., and therefore susceptible to SiO condensation. There is therefore a need to prevent ambient furnace gas from reaching these "cold" surfaces.

Another challenge encountered in horizontal sheet growth is the limited visibility by an operator or camera to the horizontal sheet/melt interface in the area underneath a cooling zone created by the cooling device. Notably, for proper growth of a silicon sheet, the lower surface of the cooling device may be maintained at a distance less than −3 mm from the Si melt surface, in order to maximize cooling, making visible access to the leading edge of the ribbon difficult.

With respect to these and other considerations the present improvements are provided.

BRIEF SUMMARY

In one embodiment, an apparatus for forming a crystalline sheet may include a crystallizer comprising a first gas channel and a second gas channel. The first gas channel and second gas channel may extend through the crystallizer to a lower surface of the crystallizer between an upstream edge and a downstream edge. The first gas channel may be disposed closer to the downstream edge than the second gas channel. A first gas source may be coupled to the first gas channel, where the first gas source comprises helium or hydrogen, and a second gas source may be coupled to the second gas channel, where the second gas source does not contain hydrogen or helium.

In another embodiment, an apparatus may include a housing to contain a melt, where the melt has a melt temperature and defines a melt surface. The apparatus may further include a crystallizer disposed over the melt and having an upstream edge, a downstream edge, and a lower surface, where the lower surface faces the melt surface, and where the crystallizer generates a first temperature in at least a portion of the lower surface, lower than the melt temperature. The crystallizer may include a first gas channel and a second gas channel, where the first gas channel and the second gas channel extend to the lower surface, and where the first gas channel is disposed closer to the downstream edge than the second gas channel. The apparatus may also include a first gas source coupled to the first gas channel, the first gas source containing helium or hydrogen; and a second gas source coupled to the second gas channel, the second gas source not containing hydrogen or helium.

In another embodiment, a method may include directing an asymmetric gas flow from a crystallizer to a melt surface of a melt, while crystallizing a crystalline sheet along the melt surface. The directing of the asymmetric gas flow may include directing a first gas flow along a first direction through a first gas channel through the crystallizer, where the first gas flow contains helium or hydrogen. The directing of the asymmetric gas flow may also include directing a second gas flow along the first direction through a second gas channel through the crystallizer, where the second gas channel is disposed upstream of the first gas channel, and the second gas flow does not contain hydrogen or helium.

BRIEF DESCRIPTION OF THE DRAWINGS

FIG. 4 depicts an exemplary process flow.

DETAILED DESCRIPTION

The present embodiments provide apparatus and techniques to grow a continuous crystalline sheet of semiconductor material such as silicon form a melt using horizontal growth. In particular, the apparatus as disclosed herein are configured for initializing and sustaining the growth of a continuous crystalline sheet or ribbon of silicon on the surface of a melt, such that the sheet formed is single-crystal (monocrystalline), wide, of uniform thinness, and drawn from the melt at a fast rate, such as greater than 1 millimeter per second. In various embodiments, a novel crystallizer is provided having a plurality of channels, where the crystallizer provides asymmetric gas flow adjacent an erstwhile melt surface of a melt such as silicon. In various embodiments, an apparatus is provided including a crystallizer where the peak rate of heat removal from a silicon melt surface exceeds 100 W/cm$^2$ while formation of SiO and condensation of SiO on surfaces within the apparatus is suppressed or eliminated.

In various embodiments, described below the different channels of a novel crystallizer are configured in different asymmetric configurations that enhance crystallization of a crystalline sheet while suppressing SiO formation. In various embodiments, a first channel is located closer to a downstream side of the crystallizer than a second channel, meaning closer to the side for drawing the crystalline sheet. The first channel may be supplied with helium or hydrogen, or a mixture of the two, where a highly thermally conductive gas is directed to a melt surface, while the second channel is provided with a gas of lower thermal conductivity, not including helium or hydrogen. As detailed below, this asymmetry in the type of gas provided to the surface of a melt as a function of position along the crystallizer may facilitate control of gas flow at the melt surface, so that vortex formation may be promoted on the downstream side, while non-vortex flow is promoted on the upstream side. As also described below, in some embodiments, the first channel and second channel may additionally be asymmetrically positioned in the crystallizer, where the first channel is separated by a distance from the downstream edge of the crystallizer that is greater than a distance between the second channel and the upstream edge.

Figure 1A:
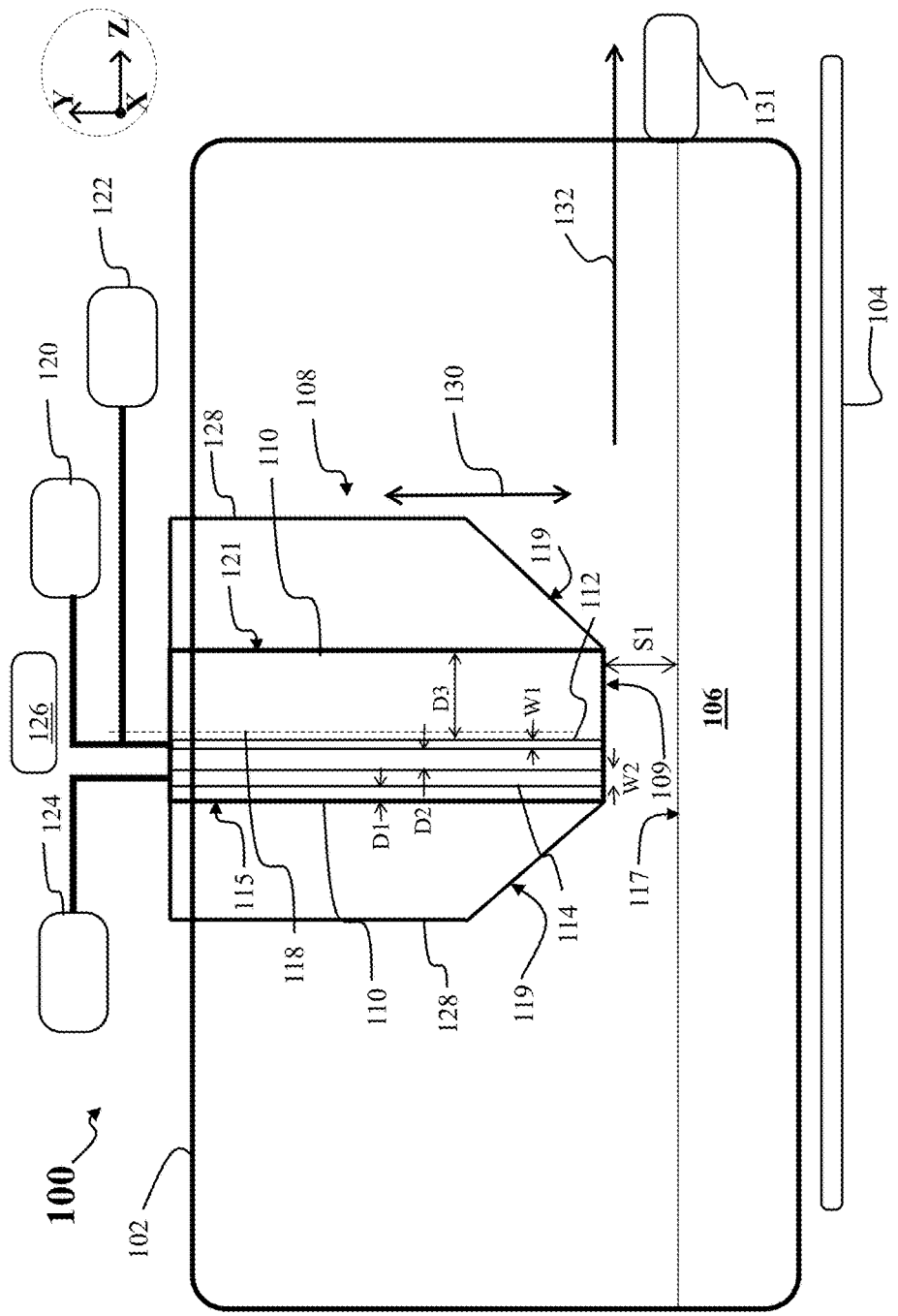
FIG. 1A depicts a side cross-sectional view of an apparatus according to embodiments of the disclosure.

FIG. 1A depicts a side view of an apparatus 100 for horizontal growth of a crystalline sheet from a melt consistent with the present embodiments. As detailed below, the apparatus 100 address several problems presented using known apparatus for horizontal sheet growth.

The apparatus 100 includes a housing 102, where the housing 102 may be a crucible, and a heater 104, where the heater 104 may be used to generate a melt 106, as shown. Moreover, in this figure and others to follow various components may not be presented to scale with respect to one another or with respect to different directions. The housing 102 may be, for example, the outside walls of a furnace and may include a crucible, such as a quartz crucible, forming at least a portion of the housing. To form the melt 106, the heater 104, in some embodiments comprising multiple heaters, may generate heat flow into the housing 102 to generate a temperature in excess of the melting temperature of the material forming the melt 106, such as silicon.

The apparatus 100 may further include a crystallizer 108, where the crystallizer 108 is disposed at least partially within the housing 102. The crystallizer 108 may be movable, for example, at least along a direction 130, lying parallel to the Y-axis of the Cartesian coordinate system shown.

The crystallizer 108 may include a first gas channel 112 and a second gas channel 114, as shown. While not shown in FIG. 1A, in various embodiments, the crystallizer 108 may be formed from a cold block, where the cold block contains the first gas channel 112, and a second block disposed adjacent the cold block and containing the second gas channel. The second block may be formed, for example, from a quartz material, where the quartz material has low thermal conductivity. In other embodiments, the crystallizer 108 may be a single block.

As shown in FIG. 1A, the first gas channel 112 and second gas channel 114 may extend vertically through the crystallizer 108, that is, along the Y-axis, where the first gas channel 112 and the second gas channel 114 extend to a block lower surface 109. In various embodiments, at least a portion of the crystallizer 108 may be cooled by a fluid, such as water cooled. Cooling channels (not shown) may be provided within at least a portion of the crystallizer 108, so when water is flowed through the cooling channels, the cold block temperature of the cold block may be much lower than the temperature of the melt 106. For example, the temperature of the block lower surface 109, at least in some regions, may be on the order of 100° C., while the temperature of the melt 106, may be generally in the range of 1415° C.-1430° C. The embodiments are not limited in this context.

In the situation described above, to perform horizontal sheet growth from the melt 106, heat may be rapidly removed from the melt surface 117 of the melt 106, in the region adjacent the block lower surface 109. While the block lower surface 109 is maintained at a relatively low temperature, a rapid gas flow may be directed via the first gas channel 112 to the melt surface 117. As further shown in FIG. 1A, the apparatus 100 may include a first gas source 120 coupled to the first gas channel 112, where the first gas source 120 contains a first gas such as helium or hydrogen. This helium gas or hydrogen gas may be provided through the first gas channel 112 at a relatively high flow rate, such as above one liter/(minute-cm width along the X-axis). Such gases may provide high conductivity and may promote vortex formation in a region above the melt 116 adjacent the first gas channel 112.

Additionally, a second gas source 124 may be coupled to the second gas channel, where the second gas source 124 contains a second gas, where the second gas does not contain hydrogen and does not contain helium. The second gas may, for example, be an inert gas, such as argon, neon, krypton, or xenon.

In some embodiments, the first gas channel 112 may additionally be coupled to an inert gas source (other than helium) in addition to being coupled to the first gas source 120. In the embodiment specifically depicted in FIG. 1A, the first gas channel 112 is coupled to a gas source 122, where the gas source 122 represents an inert gas source (not helium) that is separate from the second gas source 124. In other embodiments, instead of providing a gas source 122, the second gas source 124 may be coupled to the first gas channel 112 and the second gas channel 114, where the second gas source provides argon gas or another non-helium inert gas.

The apparatus 100 may further include a gas flow controller 126 directing gas flow to different parts of the crystallizer 108. For example, under certain conditions, argon gas may be directed to flow through the first gas channel 112 and the second gas channel 114. Under other conditions, argon gas may be directed to flow just through the second gas channel 114, while helium gas is directed to flow just through the first gas channel 112.

As further shown in FIG. 1A, the various channels of the crystallizer 108 may be defined with respect to a centerline 118 of the crystallizer 108, where the centerline 118 runs parallel to the Y-axis. Said differently, the various channels of the crystallizer 108 may be defined with respect to an upstream edge 115 and downstream edge 121 of the crystallizer 108, where the centerline 118 is disposed midway between the upstream edge 115 and the downstream edge 121. In various embodiments, the first gas channel 112 and the second gas channel 114 are asymmetrically arranged between the upstream edge 115 and the downstream edge 121, and in particular, the first gas channel 112 is closer to the upstream edge 115 than the second gas channel 114 is to the downstream edge 121.

As detailed below, this asymmetry in location of the channels may be usefully employed to aid in generation of a cooling vortex just in regions adjacent to the downstream side of the first gas channel 112, while advantageously preventing formation of a cooling vortex in regions disposed adjacent the upstream side of the first gas channel 112. As suggested in the example of FIG. 1A, and in various embodiments, the first gas channel 112 may be disposed upstream with respect to the centerline 118, while the second gas channel 114 is disposed upstream of the first gas channel 112. In other embodiments the first gas channel 112 need not be disposed upstream of the centerline 118, while the second gas channel 114 is nonetheless closer to the upstream edge 115 than the first gas channel 112 is to the downstream edge 121.

In particular, the second gas channel 114 may be arranged at a distance D1 from the upstream edge 115 of the crystallizer 108, while the second gas channel 114 is arranged at a distance D2 from the first gas channel 112. Additionally, the first gas channel 112 is arranged at a distance D3 from the downstream edge 121 of the crystallizer 108, where D3 is greater than D1 as shown. The significance of these distances is discussed below with respect to FIG. 1C.

As further shown in FIG. 1A the apparatus 100 may include a thermal insulation block 128 disposed adjacent the crystallizer 108, or forming an outer portion of the crystallizer 108, as in known crystallizers.

As further shown in FIG. 1A, the apparatus 100 may include a crystal puller 131, disposed downstream of the crystallizer 108, where the crystal puller 131 is movable along a pull direction 132. Using this convention, the second gas channel 114 may be deemed to be disposed upstream of the first gas channel 112.

According to some embodiments, the first gas channel 112 may have a channel length, shown as W1, of 50 µm to 500 µm along the pull direction 132, and the second gas channel 114 may have a channel length, shown as W2, of 200 µm to 2000 µm along the pull direction 132. The embodiments are not limited in this context. In different embodiments, the channel length of the first gas channel 112 may be arranged to be less than the channel length of the second gas channel 114. This configuration may result in a lower flow rate for gas directed through second gas channel 114 as opposed to gas directed through first gas channel 112.

In particular embodiments, the first gas source 120 may be arranged to provide a first gas flow rate of helium through the first gas channel 112, where the second gas source 124 is arranged to provide a second gas flow rate of argon through the second gas channel 114, wherein a ratio of the second gas flow rate to the first gas flow rate is between 0.05 and 0.5. This arrangement of lower gas flow rate of argon through the second gas channel 114 and a higher gas flow rate through the first gas channel 112, in combination with the asymmetrical arrangement of the first gas channel 112 and second gas channel 114 with respect to centerline 118, may result in advantageous gas flow patterns for gas directed to the melt 106, as discussed below.

Figure 2:
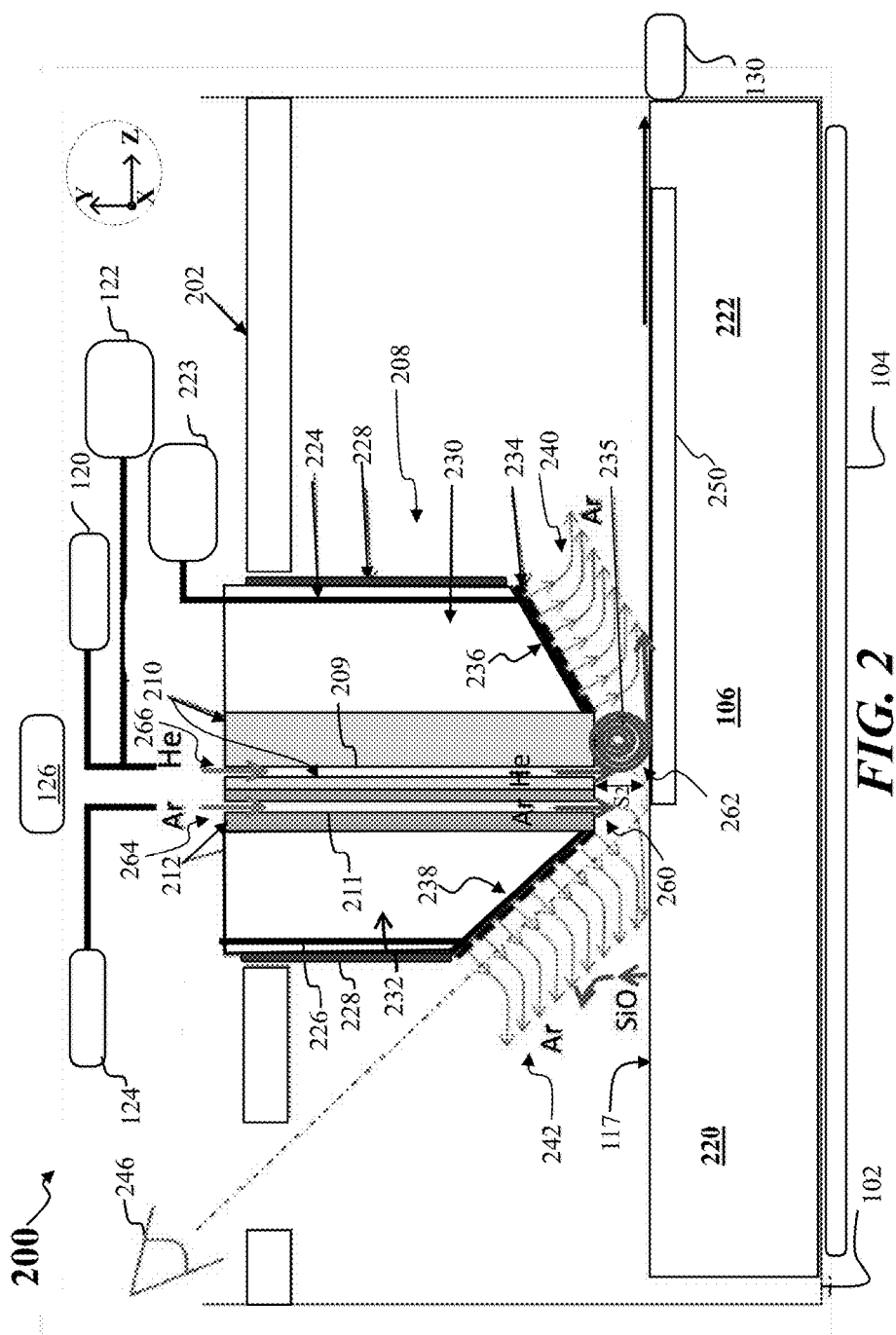
FIG. 2 depicts a side cross-sectional view of another apparatus according to other embodiments of the disclosure.

While not depicted in FIG. 1A, in further embodiments discussed with respect to FIG. 2, an apparatus similar to apparatus 100 may include a third gas source, where the third gas source does not include hydrogen or helium, and may further include a gas distribution assembly coupled to the third gas source. Such a gas distribution assembly may have a plurality of gas openings, and may be disposed along a lower edge 119 of the thermal insulation block 128.

Figure 1B:
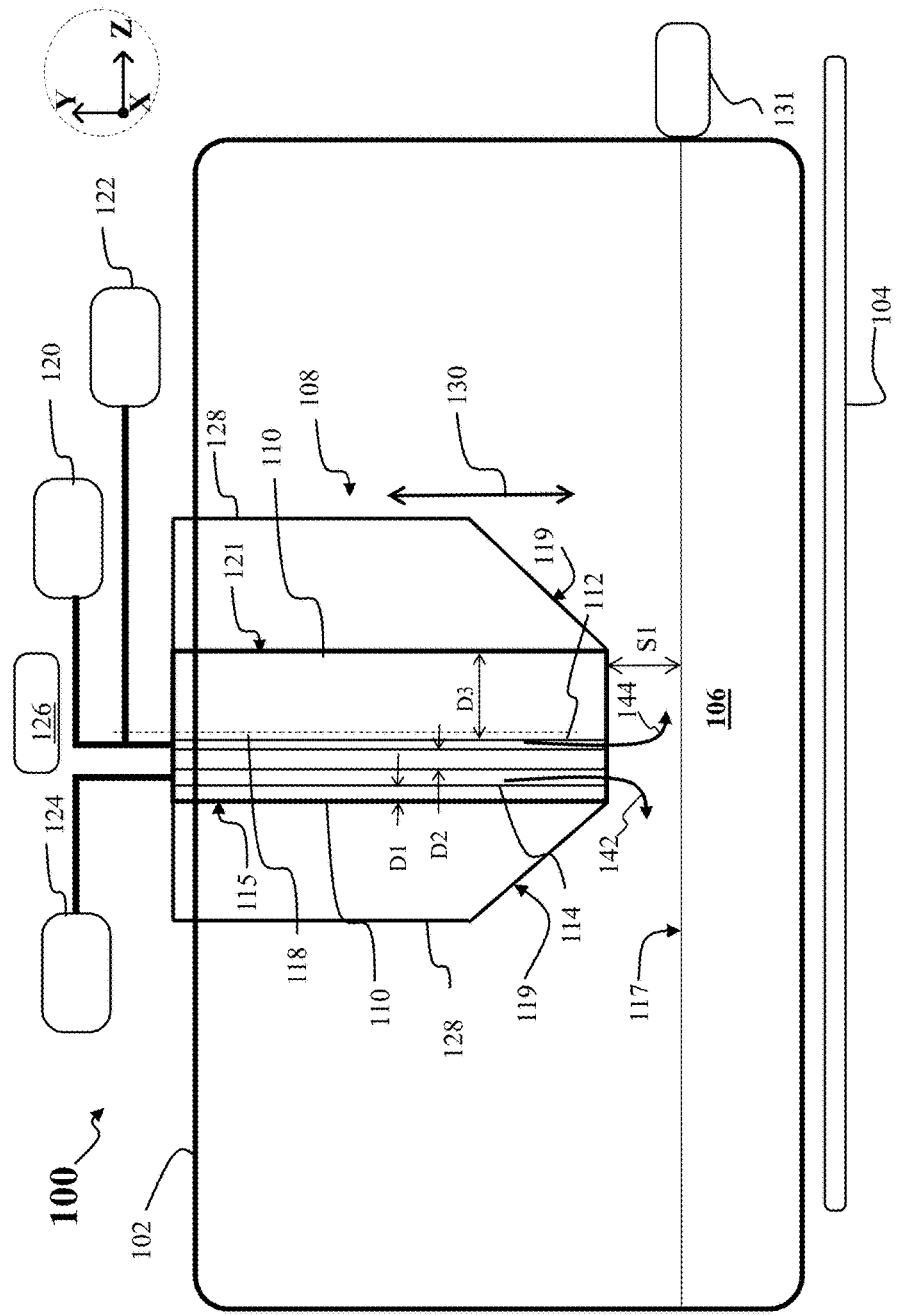
FIG. 1B and FIG. 1C depict side cross-sectional views of a first scenario and second scenario, respectively, for operation of the apparatus of FIG. 1A.

Turning now to FIG. 1B there is shown a first scenario for operation of the apparatus 100, according to embodiments of the disclosure. In this scenario, the crystallizer 108 may be disposed at a first separation S1 with respect to the melt 106, for example, the first separation S1 may be one centimeter or greater. In this scenario a first inert gas flow may be directed through the crystallizer 108 to the melt 106, where the inert gas flow may comprise a flow 142 through the second gas channel 114 and a flow 144 through the first gas channel 112. For example, the gas source 122 may provide argon to the first gas channel 112 while the second gas source 124 may provide argon to the second gas channel 114. The flow of argon to the melt surface 117 may be used to aid in maintaining a low level of SiO formation during melting of material to form the melt 106, for example, and to maintain surfaces within the apparatus 100 free of SiO condensation.

Figure 1C:
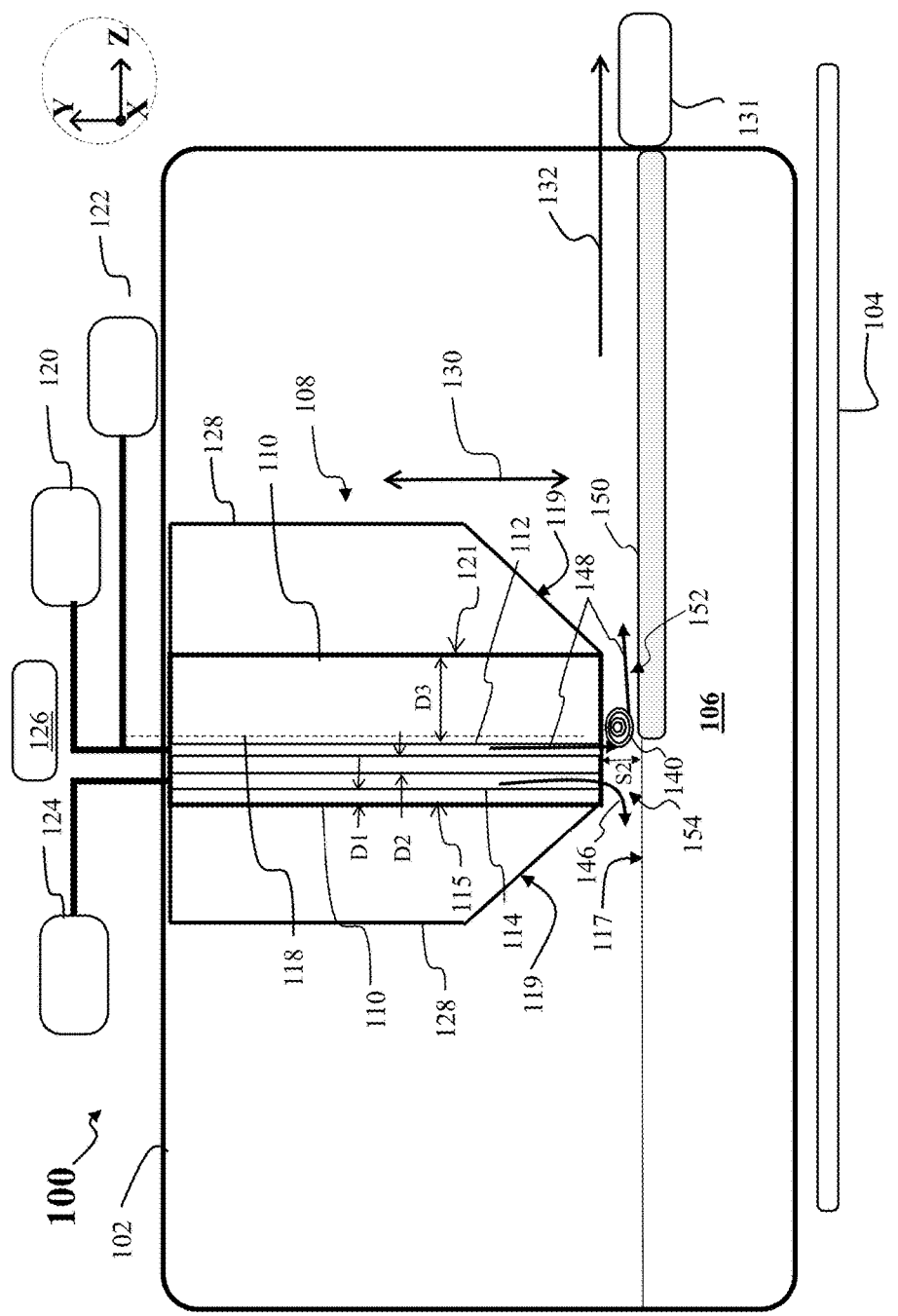

Turning now to FIG. 1C, there is shown a second scenario after the moving of the crystallizer 108 to a second separation S2 with respect to the melt 106, wherein the second separation S2 is less than the first separation S1. For example, the second separation S2 may be 3 mm, 2 mm, or similar distance. At this separation, the crystallizer 108 may provide a sufficiently rapid removal of heat so as to initiate crystallization of a crystalline sheet 150 as shown. Moreover, the crystal puller 131 may be engaged to pull the crystalline sheet 150 along the pull direction 132, wherein the crystalline sheet 150 is continuously formed and pulled from the region adjacent the crystallizer 108. As further shown in FIG. 1C, a first gas flow, shown as flow 148, is directed through the first gas channel 112, while a second gas flow, comprising a second inert gas flow, and shown as flow 146, is directed through the second gas channel 114. In this example the flow 146 may be formed from argon gas, for example, while the flow 148 is a helium gas flow or hydrogen gas flow. As shown in FIG. 1A, the flow 148 includes a vortex 140, where the vortex 140 forms in a first region 152, where the first region 152 is located between a first portion of the crystallizer 108 and a surface of the crystalline sheet 150, where the first portion is disposed adjacent the first gas channel 112. The formation of the vortex 140 aids in the ability to remove heat from the melt 106 and accordingly increase the pull rate for pulling the crystalline sheet 150, while still obtaining a stable sheet having a target sheet thickness.

As further shown in FIG. 1C, advantageously, the inert gas flow, such as argon flow, represented by flow 146 forms a laminar flow between a second region 154 located between a second portion of the crystallizer 108 and the melt surface 117, where the second portion is adjacent the second gas channel 114. As shown in FIG. 1C vortex formation is prevented in the second region 154, in particular, above the melt surface 117. This prevention of vortex formation aids in the reduction of movement of SiO forming in the melt 106 to unwanted regions of apparatus 100, such as in cold surfaces of the crystallizer 108, where the SiO may otherwise condense, forming SiOx particulates.

In order to ensure that a vortex forms to the downstream side of the first gas channel 112, meaning in the first region 152, and to ensure that no vortex forms to the upstream side of the first gas channel 112, meaning in the second region 154, the distance D1, distance D2, and distance D3 may be arranged in the following manner. For example, D1 may be less than S2, D2 may be less than S2, and D3 may be greater than S2. When the horizontal separation between the first gas channel 112 and the second gas channel 114, as represented by D2, is less than S2, a vortex will not likely form in the region between the channels. Similarly, when the horizontal separation between the second gas channel 114 and the upstream edge 115 of the crystallizer 108 is less than S2, a vortex will unlikely form in the region between the second gas channel 114 and upstream edge 115. When the distance between the first gas channel 112 and downstream edge 121 of the crystallizer 108 is greater than S2, vortex formation is promoted, especially when high velocity helium exits the first gas channel 112.

FIG. 2 depicts a side cross-sectional view of another apparatus, shown as apparatus 200, according to other embodiments of the disclosure. The apparatus 200 may share features with the apparatus 100, where like features are labeled the same. The apparatus 200 may include a crystallizer 208 as shown. The crystallizer 208 may include a cold block 210 and a second block 212, where the second block 212 is disposed adjacent the cold block 210. As shown the second block 212 includes a channel 211, while the cold block 210 includes a channel 209, where the channel 211 may be similar to second gas channel 114, while the channel 209 is similar to first gas channel 112. Generally, helium or hydrogen gas may be directed through channel 209 during formation of a crystalline sheet, shown as crystalline sheet 250. During melt formation before crystallization of a crystalline sheet, a gas such as argon may be directed through the channel 209. Moreover, during formation of a crystalline sheet, argon or other inert gas (besides helium) may be directed through channel 211 to the melt 106.

In some embodiments, the second block 212 may be formed from a quartz material such as fused quartz, fused silica, or similar material. The second block 212 may not be actively cooled in some embodiments, where the second block temperature along the lower surface of the second block 212 adjacent the melt 106 may be 300° C., 400° C., or similar temperature. Accordingly, argon or other inert gas may emerge from channel 211 at a relatively warm temperature. Additionally, because argon has a lower thermal conductivity than helium, for example, the cooling rate above the melt 106 in the region 260 below the second block 212 may be less than the cooling rate in the region 262 below cold block 210.

In various embodiments, the flow 264 may be a low velocity Ar jet, having a flow rate on the order of 5% to 50% the flow rate of the flow 266, where the flow 266 may be a high velocity helium jet or hydrogen jet. In some embodiments, the flow 264 may constitute a flow rate that is approximately 10% the flow rate of flow 266. The embodiments are not limited in this context. A relatively low flow rate of argon provided in flow 264 may act to reduce disturbances in the melt surface 117, which reduction may produce a flatter solid surface for crystalline sheet 250.

According to embodiments of the disclosure, the cooling provided by a He jet, such as flow 266, may be enhanced by arranging the lower surface of the cold block 210 to be flat and roughly parallel to the surface of the crystalline sheet just to the downstream side 222 of the channel 209, in other words, parallel to the X-Z plane. This channel region produced by the cold block 210 and the outer surface of crystalline sheet 250 may help to produce a vortex in the He flow, shown as vortex 235, where the vortex 235 cyclically cools the helium after the helium has extracted heat from the crystalline sheet 250. At the same time, as shown in FIG. 2, any He flow towards the upstream side 220 of the crystallizer 208 is minimized and no vortex forms in the region 260, as shown. In FIG. 2 the flow of argon emerging from the channel 211 may in fact be laminar. This laminar flow provided by a second gas jet of flowing Ar on the upstream side 220 provides an impediment to the flow of He over the melt surface 117. Because the thermal conductivity of argon is lower than the thermal conductivity of helium, and the lower required velocity of argon, the argon flow does not significantly cool the melt surface 117 so the melt 106 remains in molten form below region 260, meaning no vortex forms directly above the melt 106.

In accordance with various embodiments, the relative positioning of the channel 209, channel 211 within the crystallizer 208 may conform with the criteria for D1, D2, D3 and S2 discussed above with respect to FIG. 1C. In this manner formation of the vortex 235, just to the downstream side of channel 209 is promoted, while vortex formation to the upstream side of channel 209 is suppressed or prevented.

Advantageously, the flow of argon from the channel 211 also helps to keep silicon monoxide fumes from being entrained in the He jet formed by the flow 266 emerging from the channel 209. This prevention of silicon monoxide fumes maintains the vortex 235 free of silicon monoxide, so the exposed surface of the cold block 210 may also remain clean of condensed silicon monoxide. By maintaining the cold block 210 free of SiO deposits, a high cooling rate is sustained over longer periods of time during pulling of a crystalline sheet. As generally discussed previously, the second block 212 may be a low thermal conductivity material that is not water cooled or otherwise actively cooled, so argon is relatively warm when exiting the channel 211. Furthermore, because Ar has a lower conductivity than He, the Ar impinging on the melt 106.

As further shown in FIG. 2, the apparatus 200 may include a thermal insulation block comprising a first section 230 and second section 232, as well as a heater assembly 228, as shown. The thermal insulation block and heater assembly 228 prevent the cooling of the surrounding isothermal area by the crystallizer 208. The thermal insulation block may comprise a lower surface, wherein the lower surface of the thermal insulation block comprises a first lower surface 236, where the first lower surface 236 is disposed proximate the cold block 210, and a second lower surface 238 disposed adjacent the second block 212. The first lower surface 236 may form a first angle with respect to melt surface 117, and wherein the second lower surface 238 forms a second angle with respect to the melt surface 117, wherein the second angle is greater than the first angle. In some embodiments, the second angle may be approximately 45 degrees. In particular, the apparatus 200 may include a viewing station 246, where the process of crystalline sheet formation may be viewed more easily from an observation port on the apparatus, due to the steeper angle formed by the second lower surface 238. Additionally, because the second angle may be relatively steep, and because the second lower surface 238 may be very close to the channel 211, the immediate sloping of the crystallizer 208 provided by the second lower surface 238 on the upstream side 220, as well as the lower Ar flow rate and velocity of the flow 264, further prevents vortex formation and ensures laminar flow in region 260.

As further illustrated in FIG. 2, the apparatus 200 may include a third gas source 223, where the third gas source 223 does not include hydrogen or helium, and may be an argon gas source in some embodiments. The third gas source 223 may be coupled to a gas distribution assembly 234, provided in the apparatus 200, where the gas distribution assembly 234 may comprise a plurality of openings as shown, and where the gas distribution assembly 234 may be disposed along the lower surface of the insulator block. In various embodiments, the spacing between openings in the gas distribution assembly 234 may be approximately 1 mm, 2 mm, or 3 mm. The embodiments are not limited in this context. In the example of FIG. 2, a first gas channel 224 and a second gas channel 226 may be coupled to the third gas source 223, to provide gas flow to the gas distribution assembly 234. The embodiments are not limited in this context.

The gas distribution assembly 234 may help prevent buildup of silicon monoxide on the bottom surface of the insulator block, meaning the first lower surface 236 and second lower surface 238. The gas distribution assembly may be arranged as providing low velocity argon 242 on the upstream side 220 and low velocity argon on the downstream side 222 of the insulator block, as shown. The showerhead material forming the gas distribution assembly 234 may be made from an inert material, such as silicon carbide-coated graphite, where this material helps to enclose the insulator block and prevent the insulator block from contaminating the growth area (since particles of insulation may in principle cause impurity-nucleated polycrystalline growth). The first gas channel 224 and a second gas channel 226 may be disposed in close proximity to the heater assembly 228, so that the melt 106 and crystalline sheet 250 are not significantly cooled by the flowing argon. On the upstream side 220 of the crystallizer 208, near the channel 211, the absence of a vortex prevents the transportation of silicon monoxide to the colder surfaces of the crystallizer 208.

Figure 3:
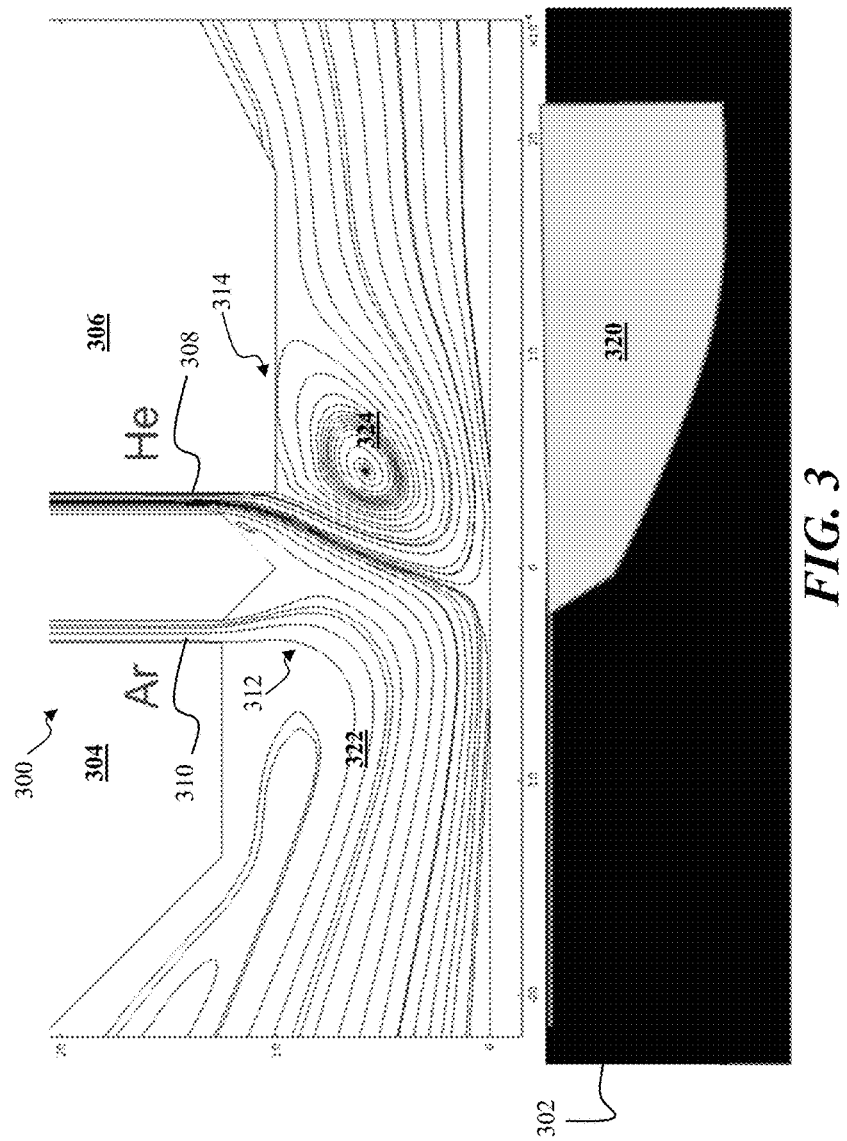
FIG. 3 depicts simulation of gas flow adjacent a crystallizer and melt, in accordance with an embodiment of the disclosure.

FIG. 3 shows the results of computational flow dynamic (CFD) modeling of a crystallizer apparatus according to embodiments of the disclosure, showing gas flows from a crystallizer device 300. As illustrated, a melt 302 is provided, while a first gas channel 308 directing helium to the melt 302 is shown, in addition to a second gas channel 310 directing argon simultaneously to the melt 302 is also shown. The Ar flow is approximately 10% of the He flow (by volume). Thus the Ar velocity is low compared to the velocity of the He. The width of the second gas channel 310 may be larger than the width of the first gas channel 308, further ensuring that the velocity of argon is relatively low compared to the velocity of helium. A low velocity of the Ar jet reduces disturbances in the liquid surface of melt 302, producing a flatter solid surface for a crystalline sheet 320, formed below the crystallizer device 300. The CFD model clearly shows that a vortex 314 is formed on the He side, while there is no vortex on the Ar side, just a laminar flow 312, even though a small amount of He leaks to the upstream (Ar) side. In particular, in the region 322, disposed proximate to and upstream from the second gas channel 310, no vortex forms, while in the region 324, disposed proximate to the first gas channel 308 and generally downstream of the first gas channel 308, a strong vortex forms. This asymmetry of gas flow provides the advantages of placing the vortex flow just over solid regions (crystalline sheet 320), where SiO generation is minimal, while providing just laminar flow over liquid regions (melt 302), where SiO may be generated. Accordingly, any SiO generated over the liquid regions may be less likely to be entrained in a vortex and distributed to unwanted surfaces. Notably, the amount of He flow to the melt side may be reduced by increasing the Ar flow through the second gas channel 310 as desired.

Notably, while some of the aforementioned embodiments illustrate configurations where a first channel and second channel are located to the upstream side of a centerline of a crystallizer, in other embodiments, the first channel need not be located to the upstream side of the crystallizer. In particular, the first channel need not be on the upstream side of the crystallizer, so long as during crystallization, the distances D1 and D2 are generally less than the second separation S2 as defined above.

FIG. 4 depicts an exemplary process flow 400. At block 402, a first inert gas flow is directed through a crystallizer when the crystallizer is disposed at a first separation with respect to a melt. The crystallizer may include a first gas channel and a second gas channel. According to various embodiments, the melt may be a silicon melt and the crystallizer may include at least in part a cold block formed of a material such as nickel. At block 404, the crystallizer is moved to a second separation with respect to the melt, wherein the second separation is less than the first separation. In some embodiments, the first separation may be one centimeter or greater, while the second separation is less than five millimeters, such as three millimeters.

At block 406, a first gas flow comprising helium gas flow or a hydrogen gas flow is directed through the first gas channel, while a second inert gas flow is directed through the second gas channel when the crystallizer is disposed at the second separation.

Accordingly, the aforementioned embodiments aid in reducing a number of problems. A first advantage is that, while known crystallizer devices may produce a vortex on an upstream side and downstream side of a crystallizer device, just one vortex, located on the downstream side, is formed by apparatus arranged according to the present embodiments. This single vortex formation avoids the problems of double vortex devices, where an opportunity is provided for silicon monoxide to be transported from the Si melt surface to a water cooled block, such as a nickel block, where the SiO condenses and grows as a film or agglomeration of whiskers. Eventually this condensate may reach a thickness or length where the silicon monoxide can touch the melt, or the condensed material may flake off and fall into the melt. Anything that falls into the melt may cause nucleation of dendritic grains of silicon, resulting in unsuitable material. The present embodiments provide additional advantages including preventing reduction in cooling rate caused when silicon monoxide builds up on a lower surface of a crystallizer apparatus, while also allowing better process monitoring of the crystalline sheet. The present embodiments also provide the advantage of preventing thermal losses that cool a melt or crystalline sheet besides the cooling caused by helium.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that the usefulness is not limited thereto and that the present disclosure may be beneficially implemented in any number of environments for any number of purposes. Accordingly, the claims set forth below are to be construed in view of the full breadth and spirit of the present disclosure as described herein.

What is claimed is:

1. An apparatus for forming a crystalline sheet, comprising:
    a crystallizer comprising a first gas channel and a second gas channel, wherein the first gas channel and the second gas channel extend through the crystallizer to a lower surface of the crystallizer between an upstream edge and a downstream edge, the second gas channel being isolated from the first gas channel, within the crystallizer,
    wherein the first gas channel is disposed closer to the downstream edge than the second gas channel, wherein a first gas source is coupled to the first gas channel, the first gas source comprising helium or hydrogen, and
    wherein a second gas source is coupled to the second gas channel, the second gas source not containing hydrogen or helium, the second gas comprising a lower thermal conductivity than a thermal conductivity of hydrogen or helium.

2. The apparatus of claim 1, wherein the second gas channel is separated from the upstream edge by a first distance D1, wherein the first gas channel is separated from the second gas channel by a second distance D2, wherein the first gas channel is separated from the downstream edge by a third distance D3, wherein the third distance D3 is greater than the first distance D1.

3. The apparatus of claim 1, wherein the crystallizer comprises:
    a cold block, the cold block containing the first gas channel and having a cold block temperature; and
    a second block, the second block disposed adjacent the cold block and containing the second gas channel, the second block having a second block temperature along a portion of the lower surface, the second block temperature being greater than the cold block temperature.

4. The apparatus of claim 1, further comprising:
    a thermal insulation block disposed adjacent the crystallizer;
    a third gas source, the third gas source not including hydrogen or helium; and
    a gas distribution assembly, the gas distribution assembly coupled to the third gas source, the gas distribution assembly comprising a plurality of gas openings, and being disposed along a lower edge of the thermal insulation block, the plurality of gas openings not being disposed along the lower surface of the crystallizer.

5. An apparatus, comprising:
    a housing to contain a melt, the melt having a melt temperature and defining a melt surface;
    a crystallizer disposed over the melt and having an upstream edge, a downstream edge, and a lower surface, the lower surface facing the melt surface, the crystallizer generating a first temperature in at least a portion of the lower surface, the first temperature being lower than the melt temperature, the crystallizer including a first gas channel and a second gas channel, the first gas channel and the second gas channel extending to the lower surface, wherein the first gas channel is disposed closer to the downstream edge than the second gas channel, the second gas channel being isolated from the first gas channel, within the crystallizer;
    a first gas source coupled to the first gas channel, the first gas source comprising helium or hydrogen; and
    a second gas source coupled to the second gas channel, the second gas source not containing hydrogen or helium, the second gas comprising a lower thermal conductivity than a thermal conductivity of hydrogen or helium.

6. The apparatus of claim 5, wherein the first gas channel and the second gas channel are asymmetrically arranged between the upstream edge and the downstream edge of the crystallizer wherein the crystallizer further comprises a centerline, wherein the first gas channel and the second gas channel are disposed between the centerline and the upstream edge.

7. The apparatus of claim 5, further comprising: a crystal puller, disposed downstream of the crystallizer, the crystal puller being movable along a pull direction.

8. The apparatus of claim 5, wherein the crystallizer comprises:
    a cold block, the cold block having a cold block temperature and containing the first gas channel; and
    a second block, the second block disposed adjacent the cold block and containing the second gas channel, the second block having a second block temperature along a portion of the lower surface, the second block temperature being greater than the cold block temperature and less than the melt temperature.

9. The apparatus of claim 8, wherein the second block comprises a quartz material, and wherein the second block is not water cooled.

10. The apparatus of claim 5, wherein the second gas source comprises a first inert gas source, wherein the first gas channel is coupled to the first inert gas source, or to a second inert gas source separate from the first inert gas source.

11. The apparatus of claim 5, further comprising:
a thermal insulation block disposed adjacent the crystallizer;
third gas source, the third gas source not including hydrogen or helium; and
a gas distribution assembly, the gas distribution assembly coupled to the third gas source, the gas distribution assembly comprising a plurality of gas openings, and being disposed along a lower edge of the thermal insulation block.

12. The apparatus of claim 8, further comprising a thermal insulation block, the thermal insulation block comprising a lower edge, wherein the lower edge of the thermal insulation block comprises a first lower edge, the first lower edge disposed proximate the cold block and a second lower edge being disposed adjacent the second block, wherein the first lower edge forms a first angle with respect to the melt surface, and wherein the second lower edge forms a second angle with respect to the melt surface, wherein the second angle is greater than the first angle.

13. A method, comprising:
directing an asymmetric gas flow from a crystallizer to a melt surface of a melt, while crystallizing a crystalline sheet along the melt surface, wherein the directing comprises:
directing a first gas flow along a first direction through a first gas channel through the crystallizer, the first gas flow comprising helium or hydrogen; and
directing a second gas flow along the first direction through a second gas channel through the crystallizer, the second gas channel being disposed upstream of the first gas channel, the second gas flow not containing hydrogen or helium, the second gas comprising a lower thermal conductivity than a thermal conductivity of hydrogen or helium.

14. The method of claim 13, wherein the crystalline sheet forms in a first region below the crystallizer along the melt surface, wherein a gas vortex forms in the first region between the crystallizer and the crystalline sheet, and wherein no gas vortex forms between the crystallizer and the melt surface in a second region, the second region being disposed upstream of the first region.

15. The method of claim 13, wherein the directing the first gas flow forms the crystalline sheet, adjacent to the first gas channel, the method further comprising pulling the crystalline sheet along a melt surface of the melt in a pull direction using a crystal puller disposed downstream of the crystallizer.

16. The method of claim 13, wherein the first direction is perpendicular to a surface of the melt, the method further comprising:
directing a first inert gas flow through the crystallizer when the crystallizer is disposed at a first separation S1 along the first direction with respect to the melt;
moving the crystallizer to a second separation S2 along the first direction with respect to the melt, wherein the second separation is less than the first separation; and
directing the first gas flow as a helium gas flow or a hydrogen gas flow through the first gas channel while directing the second gas flow as a second inert gas flow through the second gas channel when the crystallizer is disposed at the second separation.

17. The method of claim 16, wherein the directing the first gas flow comprises directing helium at a first gas flow rate, the directing the second inert gas flow comprises directing argon at a second gas flow rate, and wherein a ratio of the second gas flow rate to the first gas flow rate is between 0.05 and 0.5.

18. The method of claim 17, further comprising
providing a thermal insulation block adjacent the crystallizer;
providing a gas distribution assembly along a lower surface of the thermal insulation block; and
flowing a third inert gas flow through the gas distribution assembly at a third gas flow rate, wherein the third gas flow rate is less than the first gas flow rate.

19. The method of claim 16, wherein the crystallizer comprises an upstream edge and a downstream edge,
wherein the second gas channel is separated from the upstream edge by a first distance D1 along a second direction, the second direction being perpendicular to the first direction,
wherein the first gas channel is separated from the second gas channel by a second distance D2 along the second direction,
wherein the first gas channel is separated from the downstream edge by a third distance D3 along the second direction,
wherein D1 is less than the second separation S2, D2 is less than the second separation S2, and D3 is greater than or equal to the second separation S2.

* * * * *